(12) United States Patent
Obika

(10) Patent No.: US 9,128,261 B2
(45) Date of Patent: Sep. 8, 2015

(54) OPTICAL COMMUNICATION MODULE AND METHOD FOR MAKING THE SAME

(71) Applicant: ROHM CO., LTD., Kyoto-shi, Kyoto (JP)

(72) Inventor: Akira Obika, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/047,398

(22) Filed: Oct. 7, 2013

(65) Prior Publication Data

US 2014/0105537 A1    Apr. 17, 2014

(30) Foreign Application Priority Data

Oct. 11, 2012    (JP) ................. 2012-226028

(51) Int. Cl.
*G02B 6/36* (2006.01)
*G02B 6/42* (2006.01)
*H01S 5/022* (2006.01)

(52) U.S. Cl.
CPC .............. *G02B 6/4253* (2013.01); *G02B 6/423* (2013.01); *G02B 6/424* (2013.01); *G02B 6/4212* (2013.01); *G02B 6/4202* (2013.01); *G02B 6/4274* (2013.01); *H01S 5/02252* (2013.01)

(58) Field of Classification Search
CPC .......................... G02B 6/4253; H01S 5/02252
USPC ..................... 385/14, 88, 94; 438/27, 65
See application file for complete search history.

(56) References Cited

U.S. PATENT DOCUMENTS

| | | | | |
|---|---|---|---|---|
| 4,186,996 A * | 2/1980 | Bowen et al. | ............ | 385/92 |
| 4,818,059 A * | 4/1989 | Kakii et al. | ............ | 385/65 |
| 6,075,911 A * | 6/2000 | Goto | ............ | 385/31 |
| 6,425,695 B1 * | 7/2002 | Murata et al. | ............ | 385/88 |
| 6,485,197 B1 * | 11/2002 | Kato | ............ | 385/92 |
| 7,775,727 B2 | 8/2010 | Hamasaki et al. | | |
| 2002/0057876 A1 * | 5/2002 | Yamabayashi et al. | ......... | 385/88 |
| 2003/0059178 A1 * | 3/2003 | Kobayashi et al. | ............ | 385/94 |
| 2004/0218872 A1 * | 11/2004 | Low | ............ | 385/60 |
| 2004/0223703 A1 * | 11/2004 | Miyamae et al. | ............ | 385/88 |
| 2006/0091527 A1 * | 5/2006 | Tsai et al. | ............ | 257/706 |

* cited by examiner

*Primary Examiner* — Peter Radkowski
(74) *Attorney, Agent, or Firm* — Hamre, Schumann, Mueller & Larson, P.C.

(57) ABSTRACT

An optical communication module according to the present invention includes an optical semiconductor element with an optical function region that performs light-receiving function or light-emitting function, while also including a first resin member covering the optical semiconductor element and made of a resin that transmits light emitted from the optical function region or light to be received by the optical function region, and a second resin member covering the first resin member. The optical communication module includes an attachment hole for attaching an optical fiber. The attachment hole exposes a part of the first resin member and is open at an outer surface of the second resin member.

23 Claims, 25 Drawing Sheets

OPTICAL COMMUNICATION MODULE AND METHOD FOR MAKING THE SAME

BACKGROUND OF THE INVENTION

1. Field of the Invention

The present invention relates to an optical communication module and a method for making an optical communication module.

2. Description of the Related Art

Techniques for transmitting signals by using light as carrier wave are widely used. Optical communication modules are used for these techniques, an example of which is disclosed in Patent Document 1 (Japanese Patent No. 4406447). The optical communication module disclosed in this document includes an optical semiconductor element, which may be a light-emitting element or a light-receiving element. Optical fibers are used for transmitting light from a light-emitting element or transmitting light to a light-receiving element. In the disclosed optical communication module, the optical semiconductor element is attached to an optical fiber holder, with the optical function region of the optical semiconductor element, which performs light-emitting function or light-receiving function, exposed. Optical fibers are attached to the optical fiber holder of the optical communication module in such a manner that the end surfaces of the optical fibers face the optical function region.

In this Patent Document 1, the optical fiber holder is used for properly positioning and fixing the optical fibers with respect to the optical semiconductor element. The optical fiber holder has an opening which is open at the front end and the rear end of the holder. The optical semiconductor element is attached to the front end of the optical fiber holder, with the optical function region facing the opening, so that the optical function region is exposed from the rear end of the optical fiber holder through the opening. The optical fibers are inserted into the opening from the rear end and positioned with respect to the optical function region. In inserting the optical fibers, a resin that transmits light emitted from or to be received by the optical function region is poured into the opening. By this, the optical fibers are fixed, and the gaps between the optical function region and the optical fibers are filled with the resin. The optical fiber holder, which holds the optical fibers and the optical semiconductor element, is mounted on a substrate, along with a component such as a control IC for the optical semiconductor element, whereby the optical communication module is completed.

To protect the component such as a control IC, a cover case or a sealing resin for covering the control IC needs to be provided. To realize a low manufacturing cost and size reduction, the use of a sealing resin is preferable. However, it is difficult to provide a sealing resin so as not to cover the optical fibers. To efficiently manufacture the optical communication module, the components of the optical communication module need to be mounted collectively on a substrate. However, when the space for arranging the optical fibers is secured, it is difficult to mount the components at a high density.

SUMMARY OF THE INVENTION

The present invention has been conceived under the circumstances described above. It is therefore an object of the present invention to provide an optical communication module that can be made efficiently at a low cost and reduced in size, and to provide a method for making such an optical communication module.

According to a first aspect of the present invention, there is provided an optical communication module comprising an optical semiconductor element including an optical function region that performs light-receiving function or light-emitting function, a first resin member which covers the optical semiconductor element and which is made of a resin that transmits light emitted from the optical function region or light to be received by the optical function region, and a second resin member covering the first resin member. The optical communication module is formed with an attachment hole for attaching an optical fiber. The attachment hole exposes a part of the first resin member and is open at an outer surface of the second resin member.

In a preferred embodiment of the present invention, the attachment hole includes a bottom surface provided by a part of the first resin member and an inner side surface provided by a part of the second resin member.

In a preferred embodiment of the present invention, the bottom surface and the optical function region overlap each other as viewed in the depth direction of the attachment hole.

In a preferred embodiment of the present invention, the optical communication module further comprises a main substrate including an obverse surface and a reverse surface. The obverse surface is in contact with the second resin member. The depth direction of the attachment hole is in parallel with the obverse surface of the main substrate.

In a preferred embodiment of the present invention, the second resin member includes an opening end surface at which the opening of the attachment hole is open. The main substrate includes a substrate end surface that is flush with the opening end surface of the second resin member.

In a preferred embodiment of the present invention, the optical communication module further comprises a sub-substrate on which the optical semiconductor element is mounted. The sub-substrate stands on the obverse surface of the main substrate.

In a preferred embodiment of the present invention, the depth direction of the attachment hole is perpendicular to the sub-substrate.

In a preferred embodiment of the present invention, the first resin member is in contact with the obverse surface of the main substrate.

In a preferred embodiment of the present invention, the sub-substrate is in the form of a rectangle having four side surfaces. The first resin member includes four side surfaces that are flush with the four side surfaces of the sub-substrate, respectively.

In a preferred embodiment of the present invention, the reverse surface of the main substrate is a mount surface for surface-mounting.

In a preferred embodiment of the present invention, the optical communication module further comprises a control IC mounted on the obverse surface of the main substrate.

In a preferred embodiment of the present invention, the first resin member includes a main body and a thin layer portion. The main body covers the optical semiconductor element and includes a light transmitting surface perpendicular to the depth direction of the attachment hole. The thin layer portion covers at least part of the light transmitting surface and provides the bottom surface of the attachment hole.

In a preferred embodiment of the present invention, the thin layer portion includes an edge around a portion providing the bottom surface. The edge is positioned between the main body and the second resin member.

In a preferred embodiment of the present invention, the portion of the first resin member which covers the optical semiconductor element and the portion of the first resin member which provides the bottom surface of the attachment hole are made of a same material.

In a preferred embodiment of the present invention, the bottom surface of the attachment hole is closer to the optical semiconductor element than a surface of the first resin member which is in contact with the second resin member is.

In a preferred embodiment of the present invention, the first resin member includes a portion which is positioned between the surface in contact with the second resin member and the bottom surface of the attachment hole and which provides the inner side surface of the attachment hole.

In a preferred embodiment of the present invention, the cross sectional dimension of the attachment hole increases as proceeding toward the opening in the depth direction.

In a preferred embodiment of the present invention, the second resin member is made of opaque resin.

According to a second aspect of the present invention, there is provided a method for making an optical communication module. The method comprises the steps of forming a first resin member by covering an optical semiconductor element including an optical function region that performs light-receiving function or light-emitting function with a resin that transmits light emitted from the optical function region or light to be received by the optical function region, attaching a spacer to a portion of the first resin member which is on the opposite side of the optical semiconductor element, forming a second resin intermediate product by covering the first resin member and the spacer with a resin, forming a second resin member that exposes a part of the spacer by collectively removing a part of the second resin intermediate product and a part of the spacer, and removing the spacer.

In a preferred embodiment of the present invention, the spacer is made of a material different from the first resin member and the second resin member, and the step of removing the spacer comprises dissolving the spacer.

In a preferred embodiment of the present invention, the method further comprises the step of attaching the first resin member to a main substrate including an obverse surface and a reverse surface. The step of forming the second resin intermediate product comprises forming the second resin intermediate product in contact with the obverse surface of the main substrate. The spacer is made of a material different from the material forming the obverse surface of the main substrate.

In a preferred embodiment of the present invention, the spacer is made of a metal.

In a preferred embodiment of the present invention, the spacer is columnar.

In a preferred embodiment of the present invention, the step of attaching the spacer comprises attaching the spacer to the first resin member with a resin adhesive that transmits light emitted from the optical function region or light to be received by the optical function region.

Other features and advantages of the present invention will become clearer from the detailed description given below with reference to the accompanying drawings.

DESCRIPTION OF THE PREFERRED EMBODIMENTS

Preferred embodiments of the present invention are described below with reference to the accompanying drawings.

Figure 1:
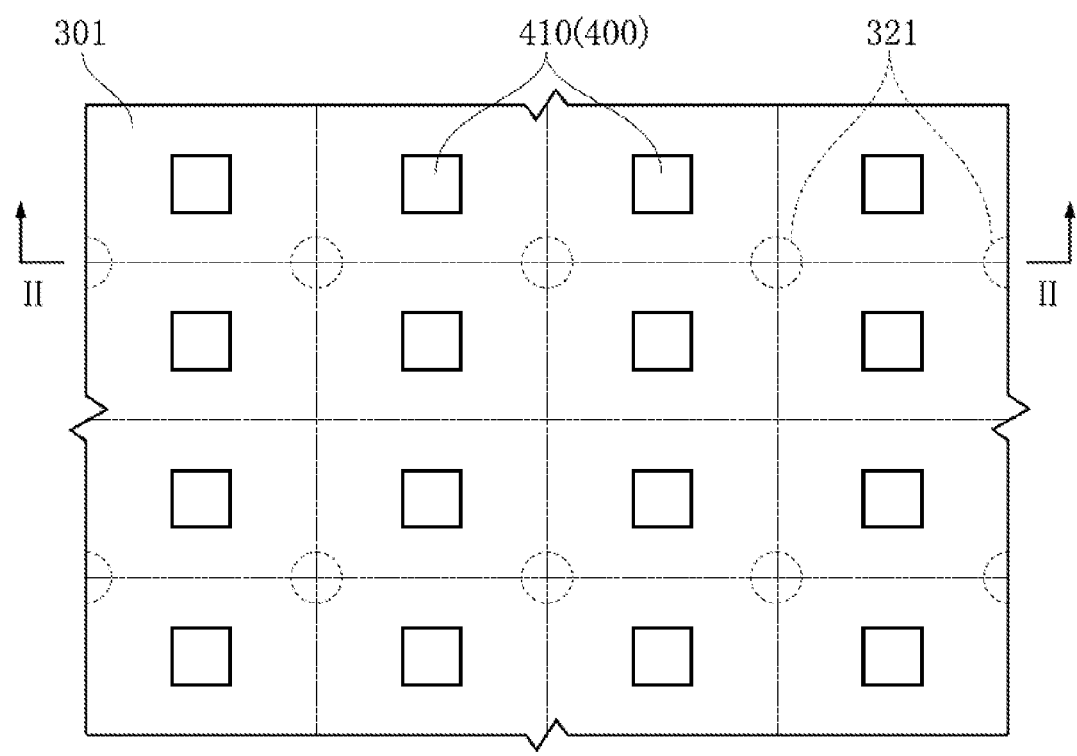
FIG. 1 is a schematic plan view showing a method for making an optical communication module according to a first embodiment of the present invention.
Figure 2:
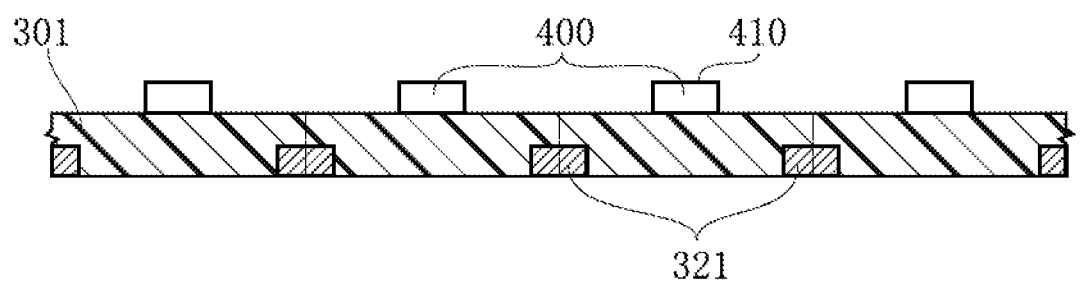
FIG. 2 is a schematic sectional view taken along lines II-II in FIG. 1.

FIGS. 1-11 show a method for making an optical communication module according to a first embodiment of the present invention. First, as shown in FIGS. 1 and 2, a sub-substrate material 301 is prepared. The sub-substrate material 301 includes a base made of e.g. glass epoxy resin or BT (Bismaleimide-Triazine) resin and wiring patterns (not shown) formed on the upper and the lower surfaces of the base. The sub-substrate material 301 further includes a plurality of through-holes 321. The through-holes 321 are electrically connected to the wiring patterns.

Then, a plurality of optical semiconductor elements 400 are mounted on the sub-substrate material 301. Each of the optical semiconductor elements 400 has an optical function region 410 that performs light-emitting function or light-receiving function. Examples of the optical semiconductor element 400 in which the optical function region 410 performs light-emitting function include an LED and a VCSEL (Vertical Cavity Surface Emitting LASER). When the optical semiconductor elements 400 are LEDs or VCSELs, the optical function regions 410 are on the upper surfaces of the optical semiconductor elements 400 in FIG. 2. Examples of the optical semiconductor element 400 in which the optical function region 410 performs light-receiving function include a photodiode. When the optical semiconductor elements 400 are photodiodes, the optical function regions 410 are on the upper surface of the optical semiconductor element 400 in FIG. 2.

In mounting the optical semiconductor elements 400 on the sub-substrate material 301, the optical semiconductor elements may be die-bonded on the wiring pattern by using electrically conductive bonding paste or connected to the wiring pattern with wires.

Figure 3:
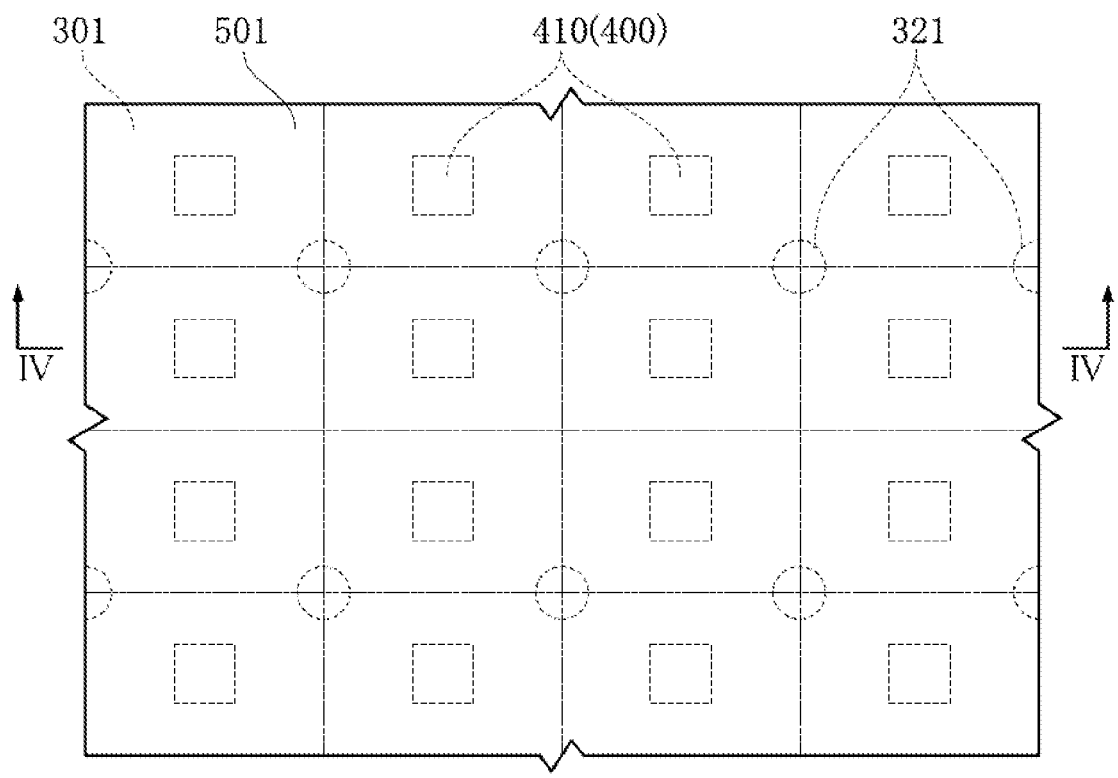
FIG. 3 is a schematic plan view showing the method for making the optical communication module according to the first embodiment of the present invention.
Figure 4:
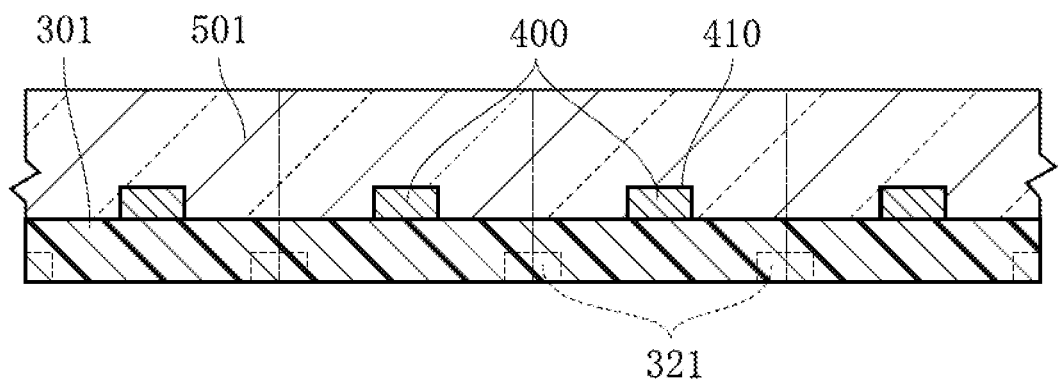
FIG. 4 is a schematic sectional view taken along lines IV-IV in FIG. 3.

Subsequently, a transparent resin material is applied onto the sub-substrate material 301 to cover the optical semiconductor elements 400 and then hardened. As a result, as shown in FIGS. 3 and 4, a first resin intermediate product 501 is obtained. The first resin intermediate product 501 covers the substantially entire surface of the sub-substrate material 301 and all of the optical semiconductor elements 400. Examples of the material for the first resin intermediate product 501 include transparent epoxy resin. Note that, as the material for the first resin intermediate product 501, an appropriate resin that transmits light emitted from the optical function regions 401 or light to be received by the optical function regions 401 is selected. For instance, when the optical function regions 401 are to receive or emit infrared light, a black resin that transmits infrared light may be used as the material for the first resin intermediate product 501.

Figure 5:
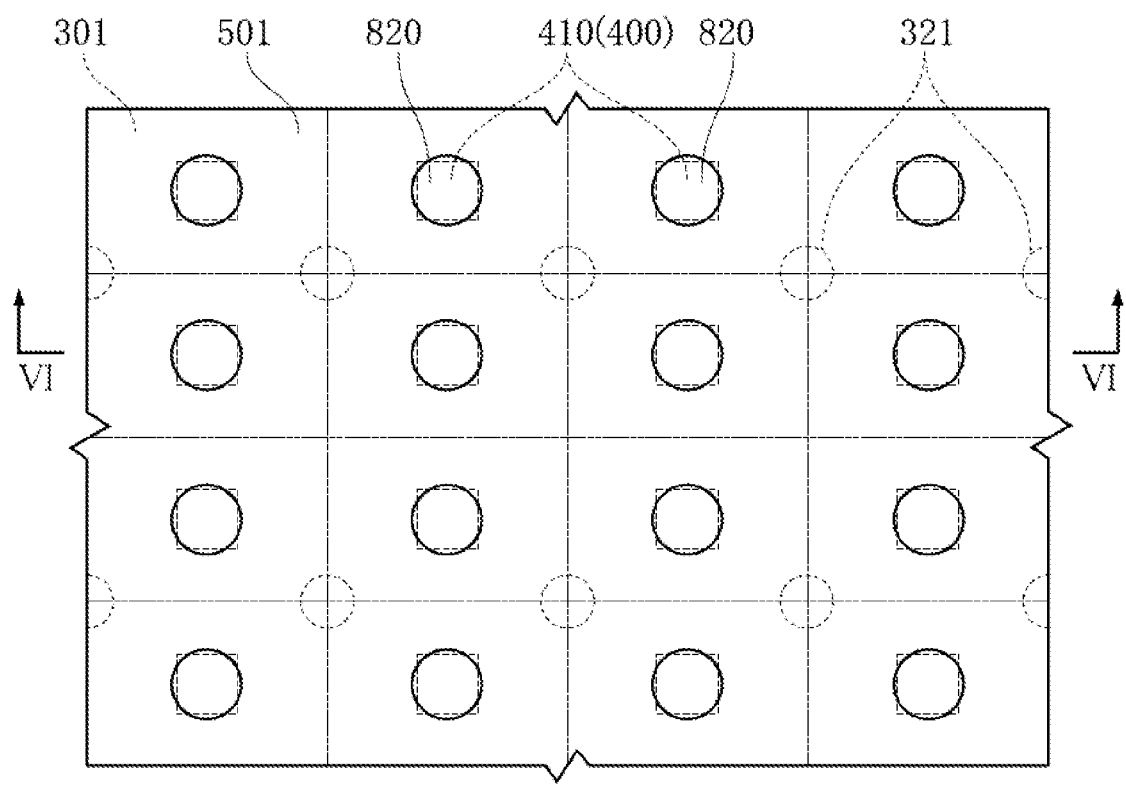
FIG. 5 is a schematic plan view showing the method for making the optical communication module according to the first embodiment of the present invention.
Figure 6:
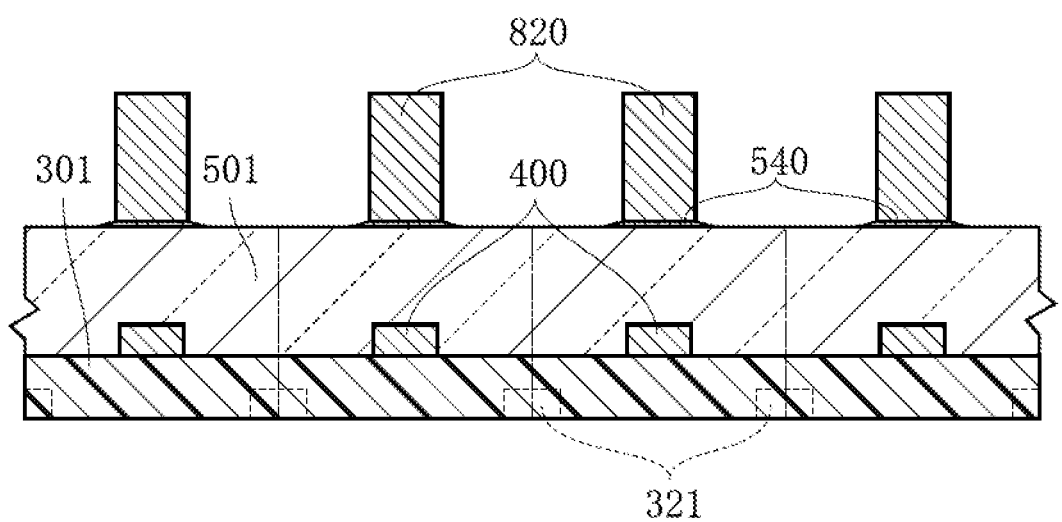
FIG. 6 is a schematic sectional view taken along lines VI-VI in FIG. 5.

Then, as shown in FIGS. 5 and 6, a plurality of spacers 820 are attached to the first resin intermediate product 501. In this embodiment, each of the spacers 820 is columnar and made of Al. As the material for the spacers 820, Al or other suitable metals such as Al alloy, AlSi, Fe, Sn alloy or Cu-based alloy may be used. However, materials other than metal can be used as long as the material allows the subsequent steps described below to be performed properly.

Each of the spacers 820 is bonded by using e.g. a transparent resin bonding material in such a manner that one of the end surfaces of each spacer faces the surface of the first resin intermediate product 501. The resin bonding material is then hardened to become thin layer portions 540. Examples for the material for the thin layer portions 540 include transparent epoxy resin and acrylic resin. The spacers 820 are arranged to overlap the optical function regions 410 of the optical semiconductor elements 400, respectively, as viewed in the thickness direction of the sub-substrate material 301. Note that, as the material for the thin layer portions 540, an appropriate resin that transmits light emitted from the optical function regions 401 or light to be received by the optical function regions 401 is selected. For instance, when the optical function regions 401 are to receive or emit infrared light, a black resin that transmits infrared light is used as the material for the thin layer portions 540.

Figure 7:
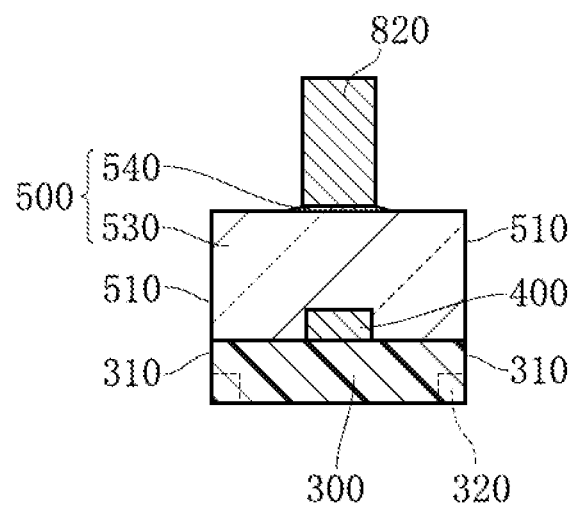
FIG. 7 is a sectional view showing the state after the sub-substrate material is cut in the method for making the optical communication module according to the first embodiment of the present invention.

Then, the sub-substrate material 301 is cut along the imaginary lines shown in FIGS. 5 and 6, whereby a plurality of intermediate products as shown in FIG. 7 are obtained. By cutting the sub-substrate material 301, the sub-substrate 300 is formed. By cutting the first resin intermediate product 501, the first resin member 500 is formed. The first resin member 500 is made up of a main body 530 and a thin layer portion 540. The main body 530 is a portion of the first resin intermediate product 501 which is cut into a rectangular parallelepiped. The sub-substrate 300 is in the form of a rectangular plate having four side surfaces 310. The first resin member 500 has four side surfaces 510. Each of the four side surfaces 310 is flush with a respective one of the four side surfaces 510. The sub-substrate 300 is provided with an electrode 320, which is obtained by cutting the through-hole 321.

Figure 8:
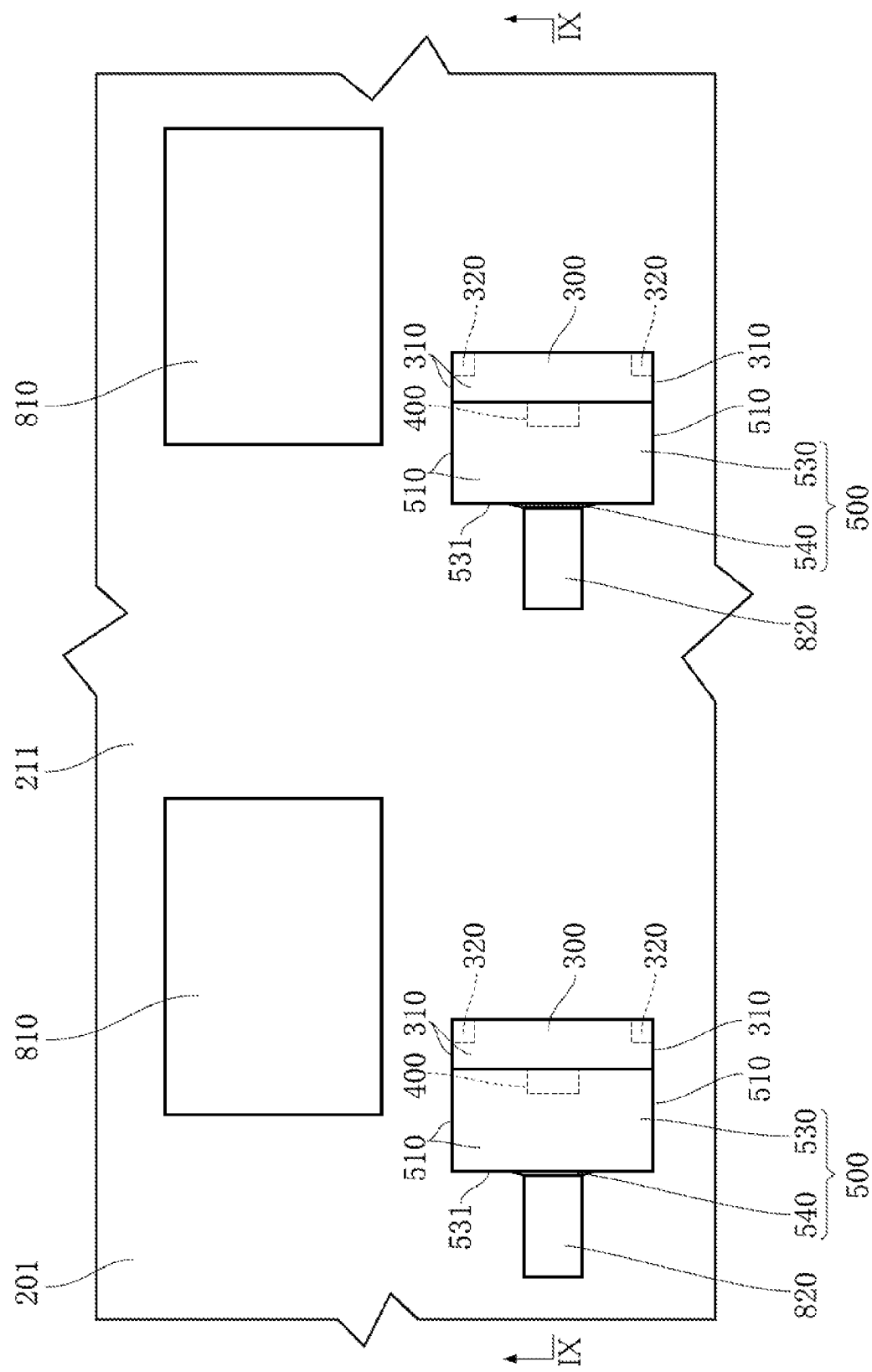
FIG. 8 is a schematic plan view showing the method for making the optical communication module according to the first embodiment of the present invention.
Figure 9:
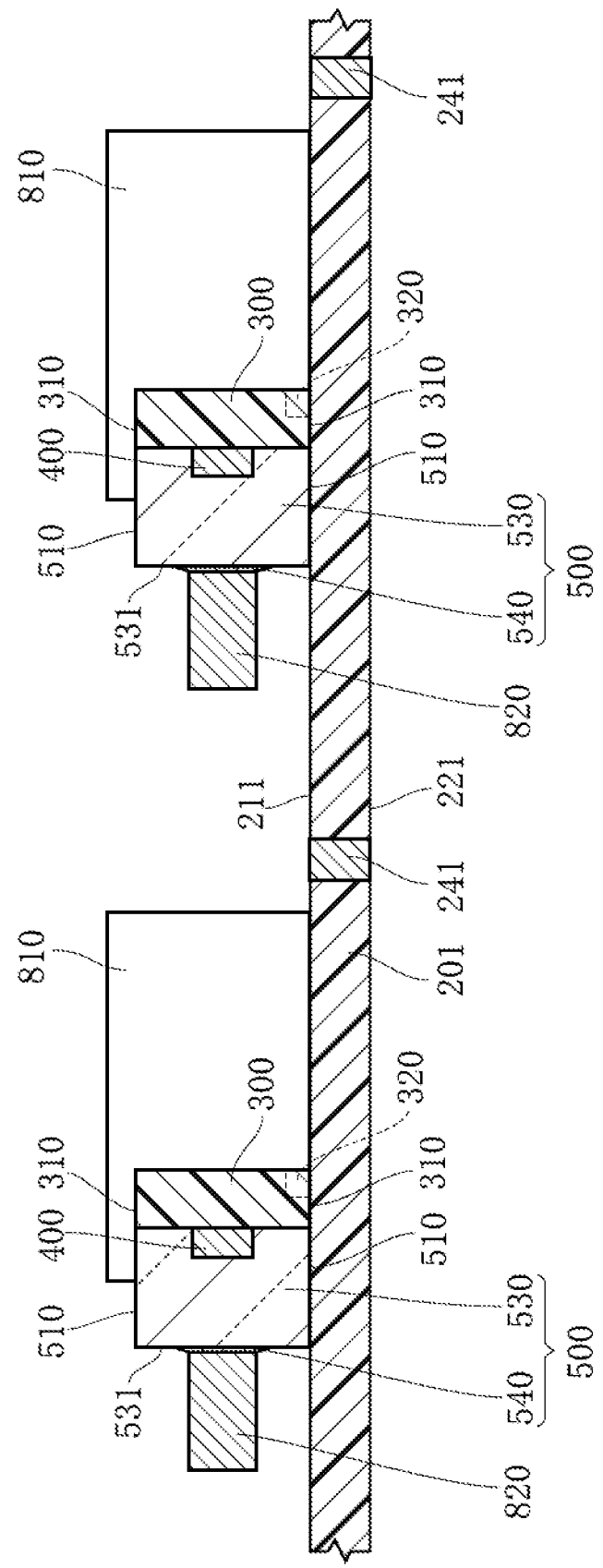
FIG. 9 is a schematic sectional view taken along lines IX-IX in FIG. 8.

Then, as shown in FIGS. 8 and 9, the intermediate products shown in FIG. 7 are mounted to a main substrate material 201. Similarly to the sub-substrate material 301, the main substrate material 201 includes a base made of e.g. glass epoxy resin and wiring patterns (not shown) formed on the upper and the lower surface of the base. The main substrate material 201 has an obverse surface 211 and a reverse surface 221. The main substrate material 201 further includes a plurality of through-holes 241. The through-holes 241 are electrically connected to the wiring patterns. The intermediate products are surface-mounted to the main substrate material 201 by using e.g. solder paste or electrically conductive paste. Thus, the electrodes 320 of the intermediate products and the above-described wiring patterns of the main substrate material 201 are electrically connected to each other. As shown in FIGS. 8 and 9, each of the intermediate products is mounted on the main substrate material 201 in such a manner that one of the side surfaces 510 and a corresponding one of the side surfaces 310 are on the obverse surface 211. Thus, the longitudinal direction of each spacer 820 is in parallel with the obverse surface 211. In FIG. 8, illustration of the through-holes 321 is omitted.

A plurality of control ICs 810 are also mounted on the obverse surface 211 of the main substrate material 201. The control ICs 810 function to control the optical semiconductor elements 400 and are electrically connected to the above-described wiring patterns of the main substrate material 201 by a plurality of non-illustrated wires.

Figure 10:
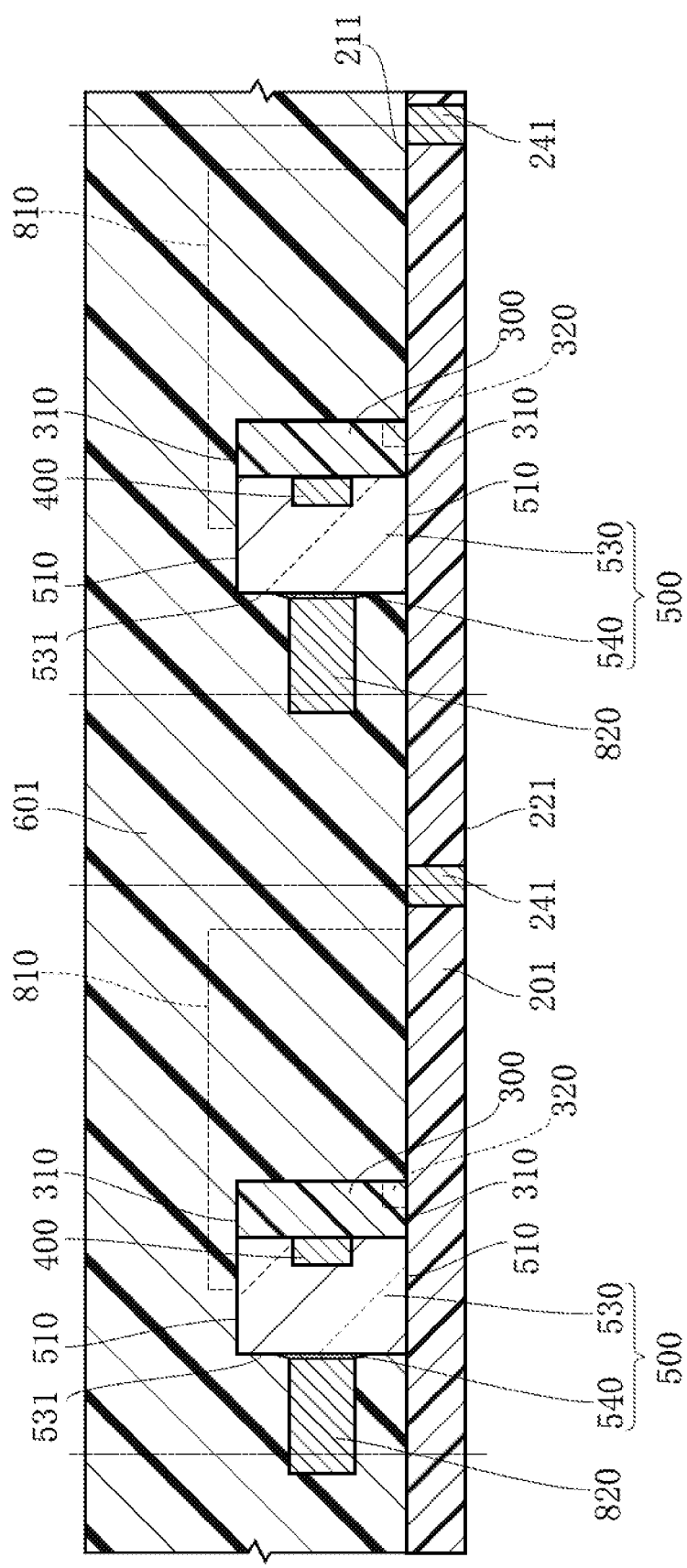
FIG. 10 is a schematic sectional view showing the method for making the optical communication module according to the first embodiment of the present invention.

Subsequently, an opaque resin material is applied onto the obverse surface 211 of the main substrate material 201 to cover the intermediate products and then hardened. As a result, as shown in FIG. 10, a second resin intermediate product 601 is obtained. The second resin intermediate product 601 covers the substantially entire surface of the main substrate material 201 and all of the above-described intermediate products. Examples of the material for the second resin intermediate product 601 include opaque epoxy resin in which a filler for adjusting the properties is mixed.

Then, the main substrate material 201 is cut along the imaginary lines shown in FIG. 10. These imaginary lines are set in such a manner that the main substrate material 201 is divided into a plurality of pieces that are rectangular as viewed in plan. Some of the cut surfaces cross the front ends of the spacers 820. By this cutting, the intermediate product as shown in FIG. 11 is obtained.

Figure 11:
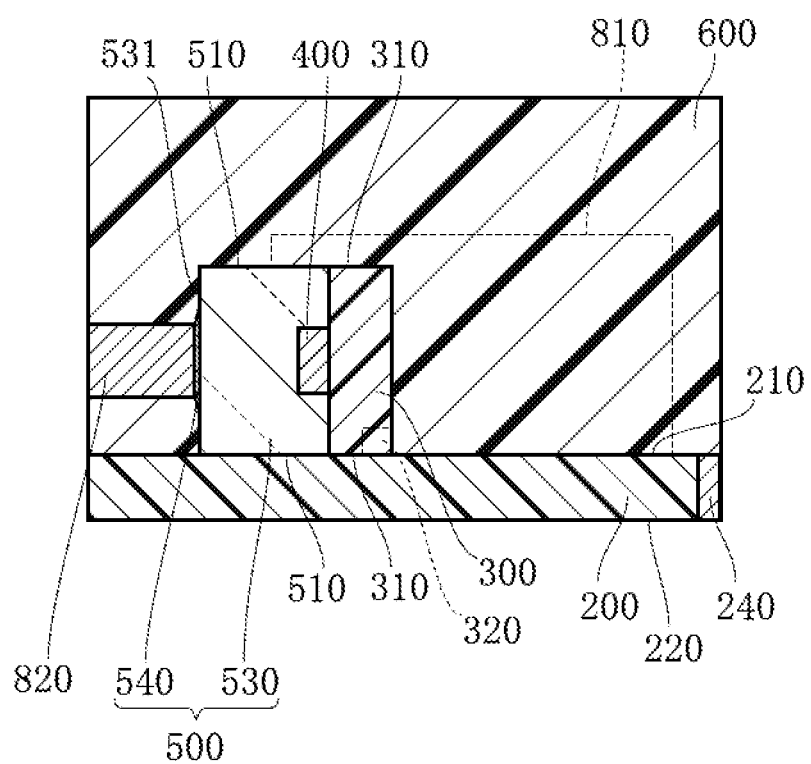
FIG. 11 is a sectional view showing the method for making the optical communication module according to the first embodiment of the present invention.

The intermediate product shown in FIG. 11 includes a main substrate 200. The main substrate 200 is rectangular and obtained by cutting the main substrate material 201 into rectangular pieces. The main substrate 200 includes an electrode 240 formed by cutting the through-hole 241. The intermediate product is further provided with a second resin member 600. The second resin member 600 is in the form of a rectangular parallelepiped and formed by cutting the second resin intermediate product 601 into a plurality of pieces. The second resin member 600 covers the intermediate product shown in FIG. 7 and the control IC 810. However, the end surface of the spacer 820 is exposed from the second resin member 600. This is because the spacer 820 is also cut when the second resin intermediate product 601 is cut.

Then, the spacer 820 is removed from the intermediate product shown in FIG. 11. This removal is performed by immersing the intermediate product into a liquid that dissolves the spacer 820 but does not dissolve the materials forming the main substrate 200, the second resin member 600 and the side surface and the reverse surface 221 of the main substrate 200 including the electrode 240. When the spacer 820 is made of Al, hydrochloric acid may be suitable as the liquid. By this removal step, the spacer 820 is selectively removed, whereby the optical communication module 101 shown in FIGS. 12-15 is obtained.

As will be understood from the manufacturing method described above, the optical communication module 101 includes the main substrate 200, the sub-substrate 300, the optical semiconductor element 400, the first resin member 500, the second resin member 600, the attachment hole 700 and the control IC 810.

Figure 12:
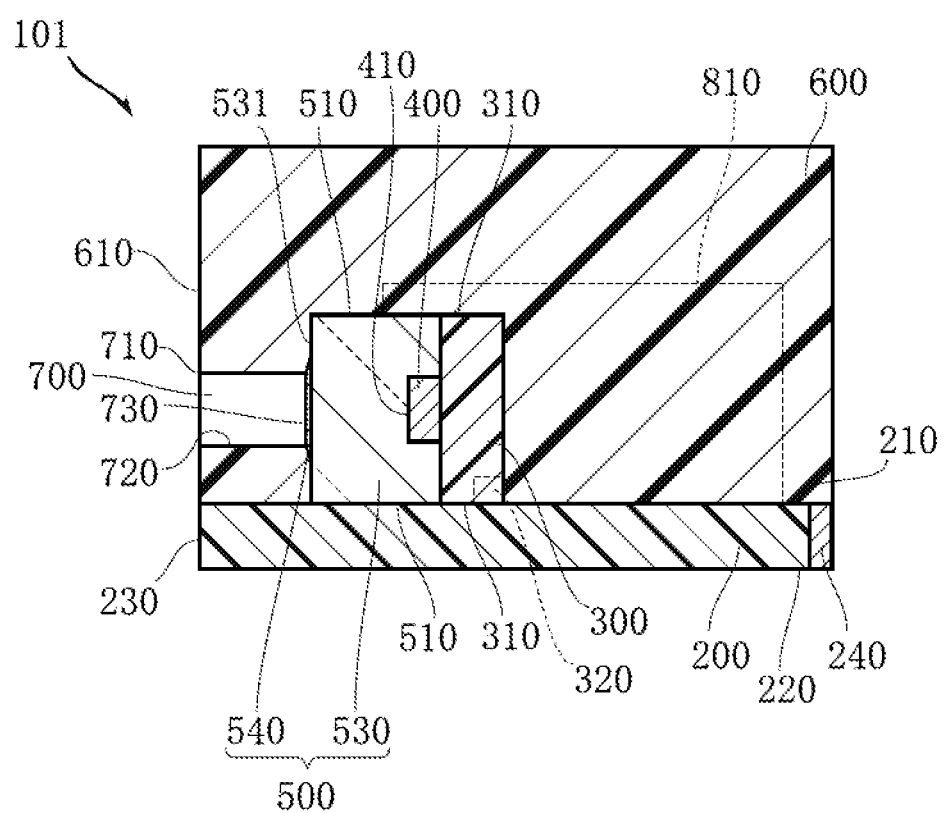
FIG. 12 is a sectional view of the optical communication module according to the first embodiment of the present invention.
Figure 13:
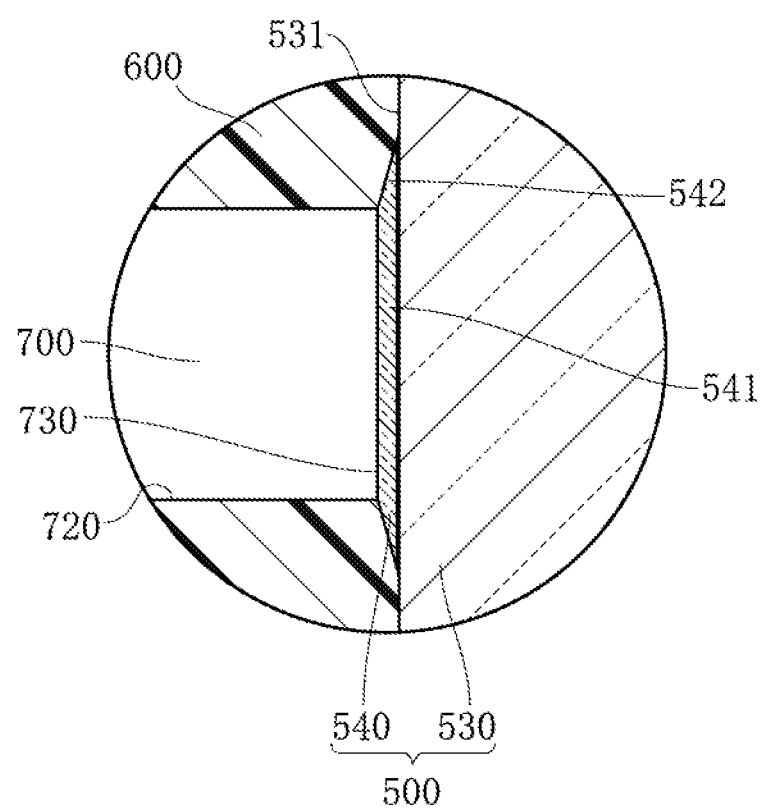
FIG. 13 is a sectional enlarged sectional view of the optical communication module of FIG. 12.
Figure 14:
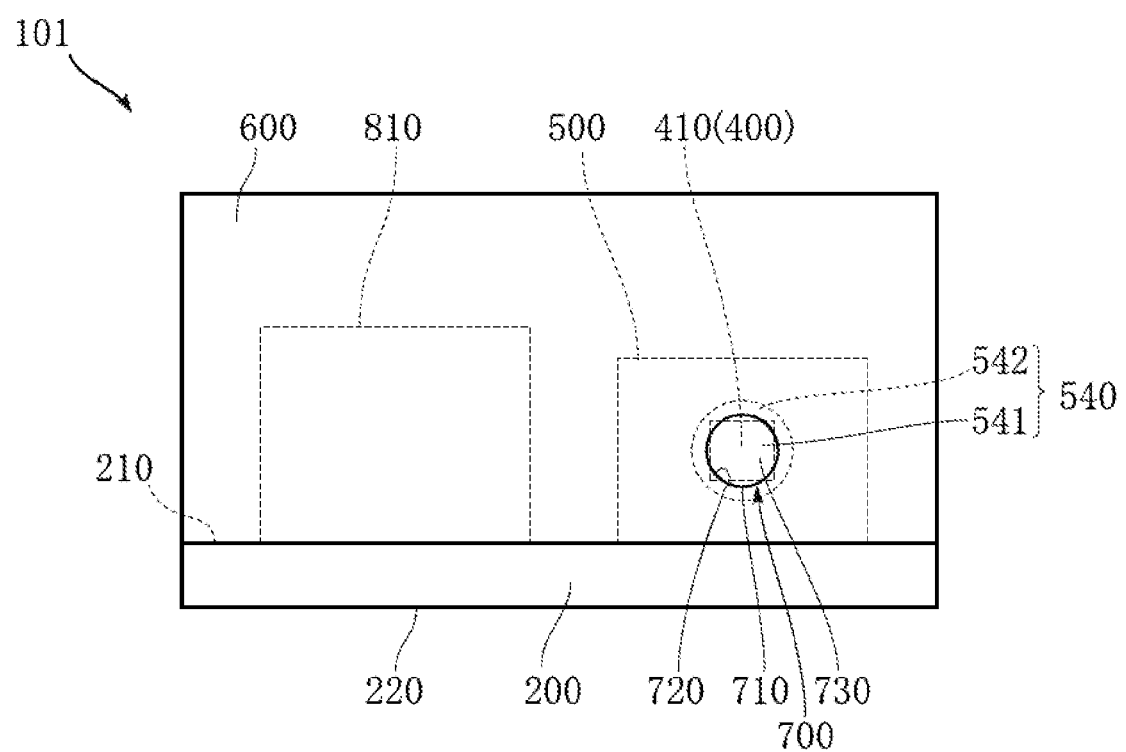
FIG. 14 is a front view of the optical communication module of FIG. 12.
Figure 15:
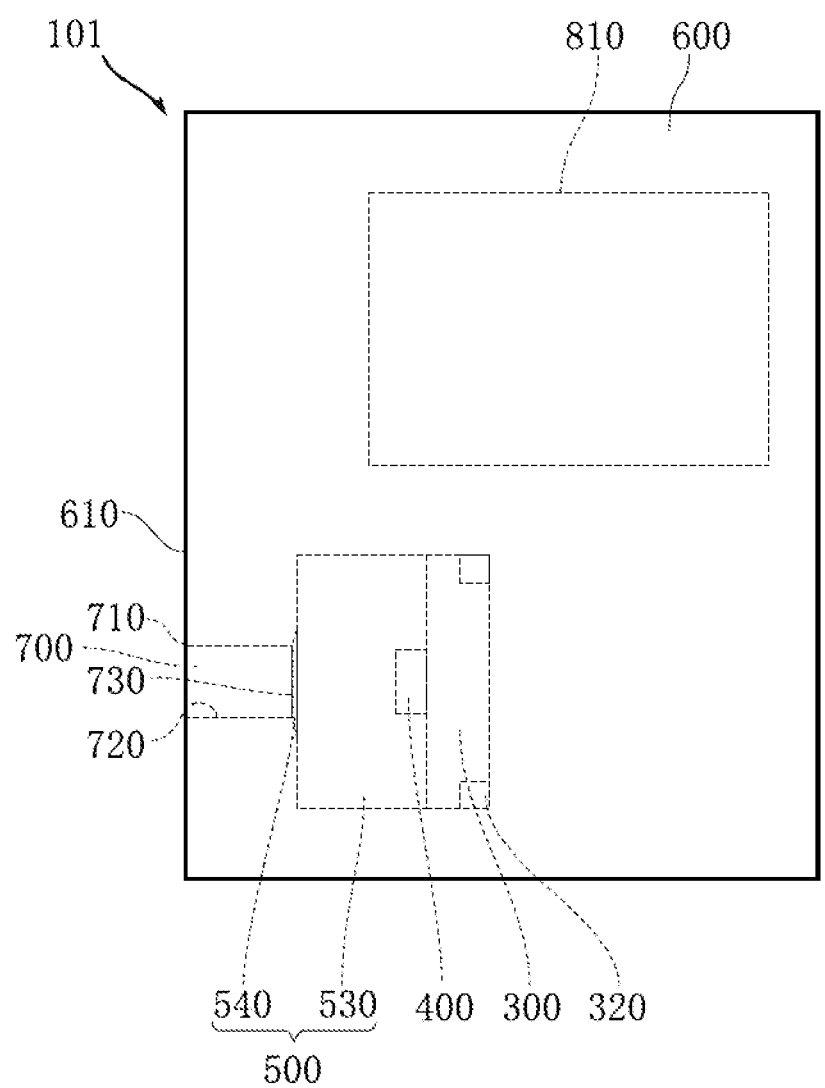
FIG. 15 is a plan view of the optical communication module of FIG. 12.

The attachment hole 700 is provided as a result of removing the columnar spacer 820 and includes an opening 710, an inner side surface 720 and a bottom surface 730. The opening 710 is open in the surface of the second resin member 600 and circular in this embodiment. The surface of the second resin member 600 in which the opening 710 is open is the opening end surface 610. The opening end surface 610 is flush with the end surface 230 of the main substrate 200. The inner side surface 720 has a shape conforming to the outer side surface of the columnar spacer 820 and is provided by the second resin member 600 in this embodiment. The bottom surface 730 is circular and provided by the thin layer portion 540 of the first resin member 500 in this embodiment. As shown in FIGS. 12-14, the thin layer portion 540 includes a light transmitting portion 541 and an edge 542. The light transmitting portion 541 constitutes the bottom surface 730 of the attachment hole 700. The edge 542 is the portion which has projected slightly outward from the spacer 820 and is positioned between the main body 530 and the second resin member 600.

As shown in FIG. 14, as viewed in the depth direction of the attachment hole 700, the opening 710 and the bottom surface 730 overlap the optical function region 410 of the optical semiconductor element 400. As shown in FIGS. 12 and 13, it is configured so that light emitted from the optical function region 410 or light traveling toward the optical function region 410 passes through the light transmitting surface 531 of the main body 530 which is in contact with the thin layer portion 540 and through the light transmitting portion 541 of the thin layer portion 540. The depth direction of the attachment hole 700 is in parallel with the obverse surface 210 of the main substrate 200 and perpendicular to the sub-substrate 300. The sub-substrate 300 stands on the obverse surface 210 of the main substrate 200.

The attachment hole 700 is used for attaching an optical fiber for transmitting light from the optical function region 410 of the optical semiconductor element 400 or transmitting light to the optical function region 410. Specifically, the optical fiber is fixed in the attachment hole 700, with an end surface of the optical fiber facing the bottom surface 730. For the fixation of the optical fiber, various methods can be employed such as clamping or bonding the optical fiber to an appropriate portion.

The advantages of the optical communication module 101 and the method for making the module are described below.

According to this embodiment, the optical fiber can be fixed by using the attachment hole 700. The second resin member 600, which constitutes part of the attachment hole 700, also functions to seal the first resin member 500, the control IC 810 and so on. Thus, the structure is advantageous as compared with a structure in which a mechanism for positioning and fixing an optical fiber is separately provided. Thus, the optical communication module 101 can be manufactured efficiently and reduced in size.

The attachment hole 700 that has the inner side surface 720 and the bottom surface 730 is suitable for attaching an optical fiber which is generally circular in cross section. Since the bottom surface 730 and the optical function region 410 of the optical semiconductor element 400 overlap each other as viewed in the depth direction of the attachment hole 700, light from the optical function region 410 of the optical semiconductor element 400 having light-emitting function is reliably guided to the optical fiber, or light from the optical fiber is reliably guided to the optical function region 410 of the optical semiconductor element 400 having light-receiving function.

The spacer 820 is attached in a standing posture to the main body 530 of the first resin member 500 in the form of a rectangular parallelepiped, and the sub-substrate 300 is attached to the main substrate material 201 with the side surface 510 of the first resin member 500 lying on the obverse surface 211 of the main substrate material 201. This makes the depth direction of the attachment hole 700 be in parallel with the obverse surface 210 of the main substrate 200.

By once attaching the spacer 820 to the first resin intermediate product 501 and selectively removing the spacer 820 after the second resin intermediate product 601 is formed, the attachment hole 700 is easily formed precisely at the position overlapping the optical function region 410. By making the spacer 820 from a metal such as Al, the spacer 820 is selectively dissolved without causing damage to structural elements made of resin such as the second resin member 600.

The second resin member 600 is made of an opaque resin material. This makes it possible to block part of unnecessary external light that does not travel through the attachment hole 700.

FIGS. 16-25 show other embodiments of the present invention. In these figures, the elements that are identical or similar to those of the foregoing embodiment are designated by the same reference signs as those used for the foregoing embodiment.

Figure 16:
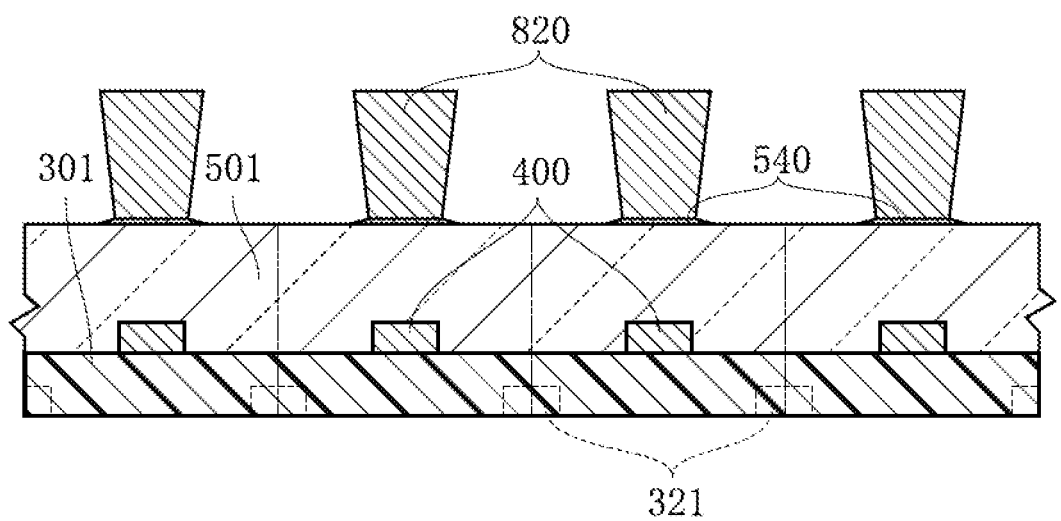
FIG. 16 is a schematic sectional view showing a method for making an optical communication module according to a second embodiment of the present invention.
Figure 17:
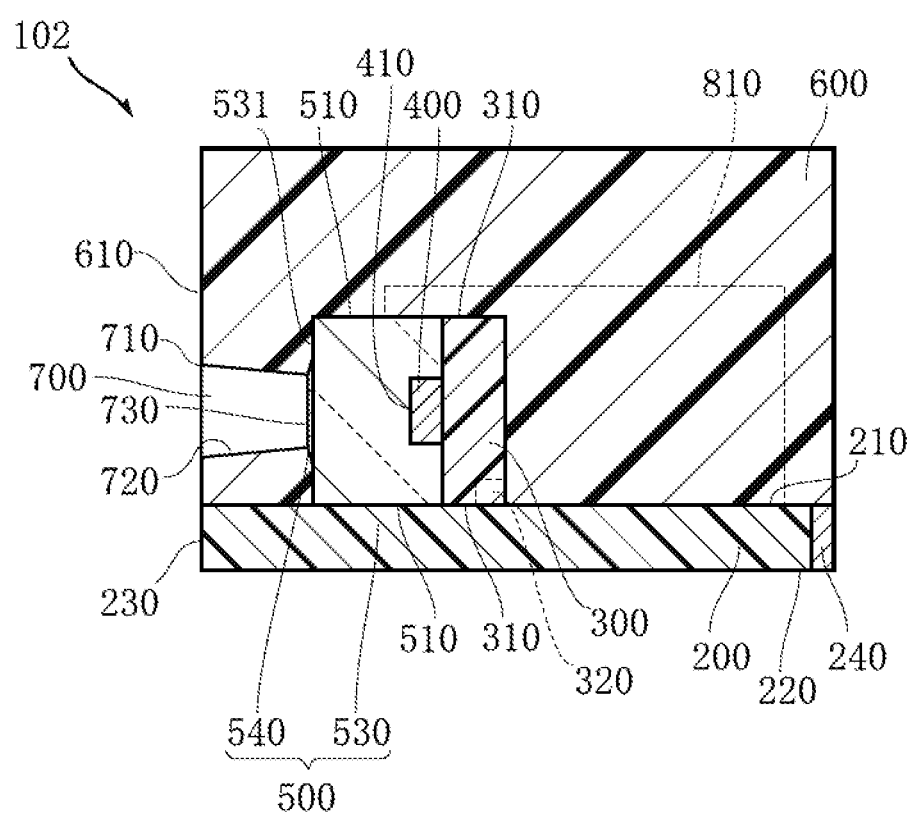
FIG. 17 is a sectional view of the optical communication module according to the second embodiment of the present invention.

FIG. 16 shows a method for making an optical communication module according to a second embodiment of the present invention. After the steps described with reference to FIGS. 1-4 are performed, a plurality of spacers 820 shown in FIG. 16 are attached to the first resin intermediate product 501. In this embodiment, each spacer 820 is in the form of a truncated cone, and its smaller end surface is bonded to the first resin intermediate product 501 via a thin layer portion 540. Thereafter, the steps described with reference to FIGS. 7-11 are performed, whereby the optical communication module 102 shown in FIG. 17 is obtained.

The optical communication module 102 differs from the optical communication module 101 in shape of the attachment hole 700. In this embodiment, the shape of the attachment hole 700 conforms to the shape of the spacer 820 in the form of a truncated cone, so that the dimension in cross section perpendicular to the depth direction increases as proceeding from the bottom surface 730 toward the opening 710.

According to this embodiment again, the optical communication module 102 can be manufactured efficiently and reduced in size. Further, according to this embodiment, in inserting an optical fiber into the attachment hole 700, the inner side surface 720 functions to center the optical fiber. Thus, the optical fiber is reliably positioned with respect to the optical function region 410 of the optical semiconductor element 400.

Figure 18:
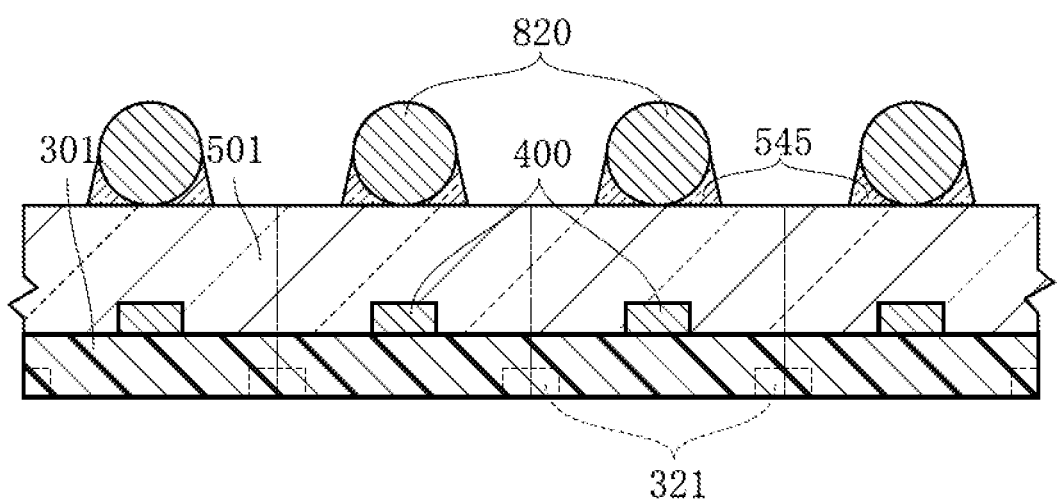
FIG. 18 is a schematic sectional view showing a method for making an optical communication module according to a third embodiment of the present invention.
Figure 19:
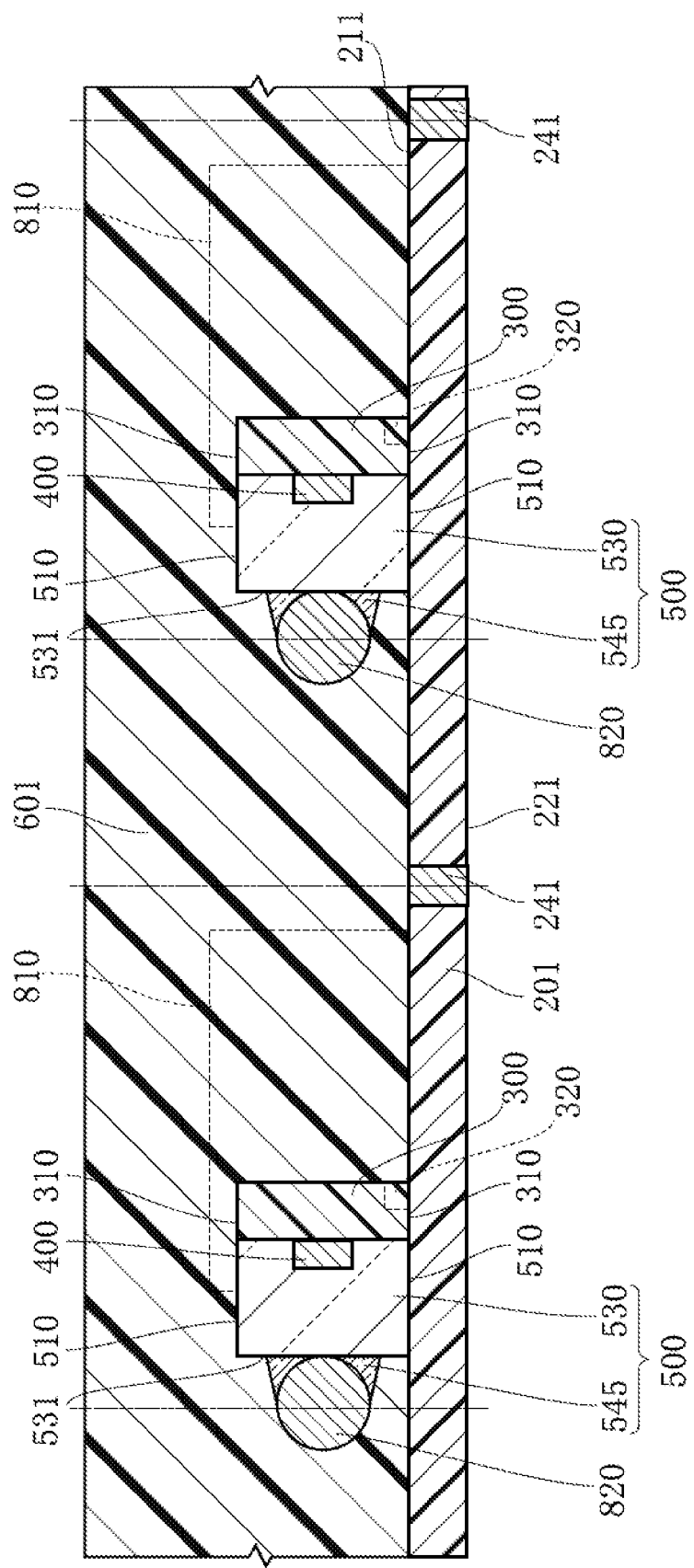
FIG. 19 is a schematic sectional view showing the method for making the optical communication module according to the third embodiment of the present invention.
Figure 20:
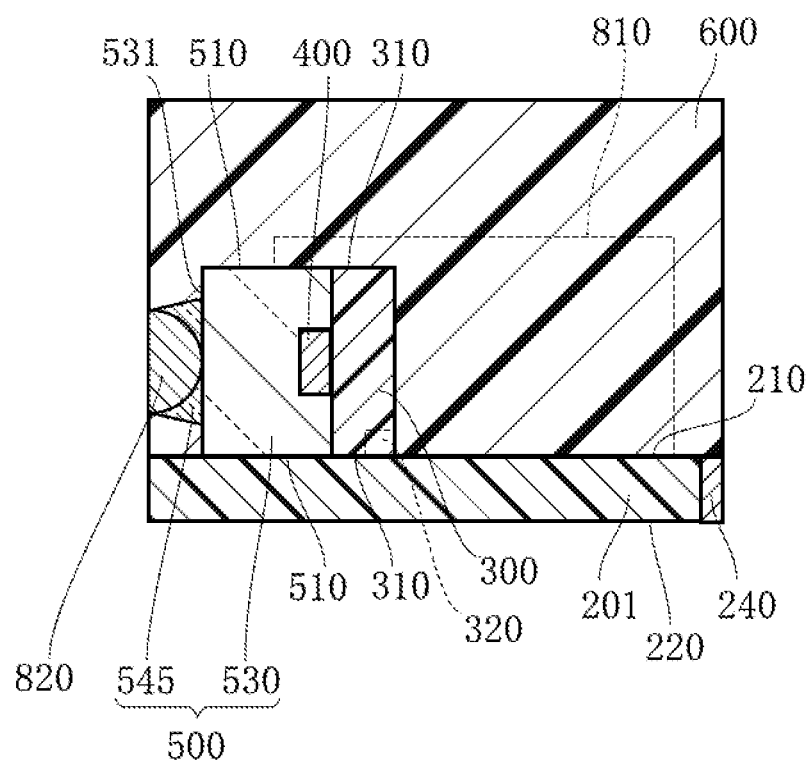
FIG. 20 is a sectional view showing the method for making the optical communication module according to the third embodiment of the present invention.

FIGS. 18-20 show a method for making an optical communication module according to a third embodiment of the present invention. In this embodiment, after the steps described with reference to FIGS. 1-4 are performed, a plurality of spacers 820 shown in FIG. 18 are attached to the first resin intermediate product 501. In this embodiment, each of the spacers 820 is spherical. For instance, attachment of the spacers 820 is performed by using transparent epoxy resin or acrylic resin. By hardening the transparent resin, bonding portions 545 are formed. Each of the spacers 820, which are spherical, is partially in direct contact with the first resin intermediate product 501 or bonded to the first resin intermediate product 501 via the thinnest portion of the bonding portion 545. As the material for the bonding portion 545, a resin that transmits light emitted from the optical function region 401 or light to be received by the optical function region 401 is used. For instance, when the optical function regions 401 are to receive or emit infrared light, a black resin that transmits infrared light is used as the material for the bonding portion 545.

Figure 21:
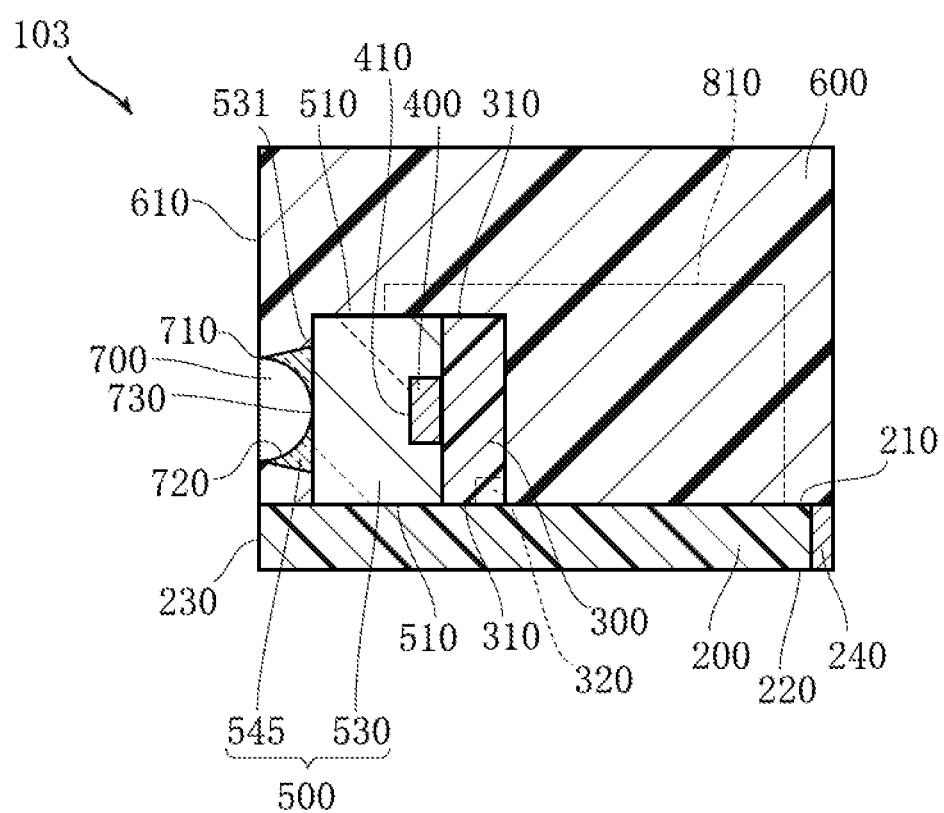
FIG. 21 is a sectional view of the optical communication module according to the third embodiment of the present invention.

Then, after the steps described with reference to FIGS. 7-9 are performed, the second resin intermediate product 601 is formed as shown in FIG. 19. Then, the main substrate material 201 is cut along the imaginary lines shown in FIG. 19. As a result, the intermediate product shown in FIG. 20 is obtained. Then, the spacer 820 is removed by e.g. selective dissolving, whereby the optical communication module 103 shown in FIG. 21 is obtained.

In the optical communication module 103 of this embodiment, the attachment hole 700 has a shape conforming to the spacer 820 made into a hemispherical shape by cutting. The side surface 720 and the bottom surface 730 are connected to each other without a clear boundary between them. In this embodiment again, as viewed in the depth direction of the attachment hole 700, the bottom surface 730 overlaps the optical function region 410 of the optical semiconductor element 400.

According to this embodiment again, the optical communication module 103 can be manufactured efficiently and reduced in size. In this embodiment again, proper centering of the optical fiber by the attachment hole 700 is expected.

Figure 22:
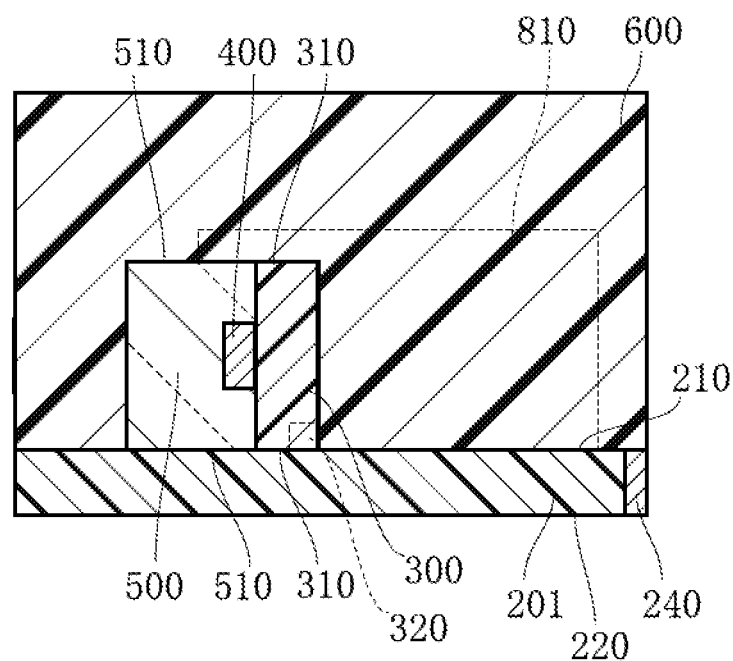
FIG. 22 is a schematic sectional view showing a method for making an optical communication module according to a fourth embodiment of the present invention.
Figure 23:
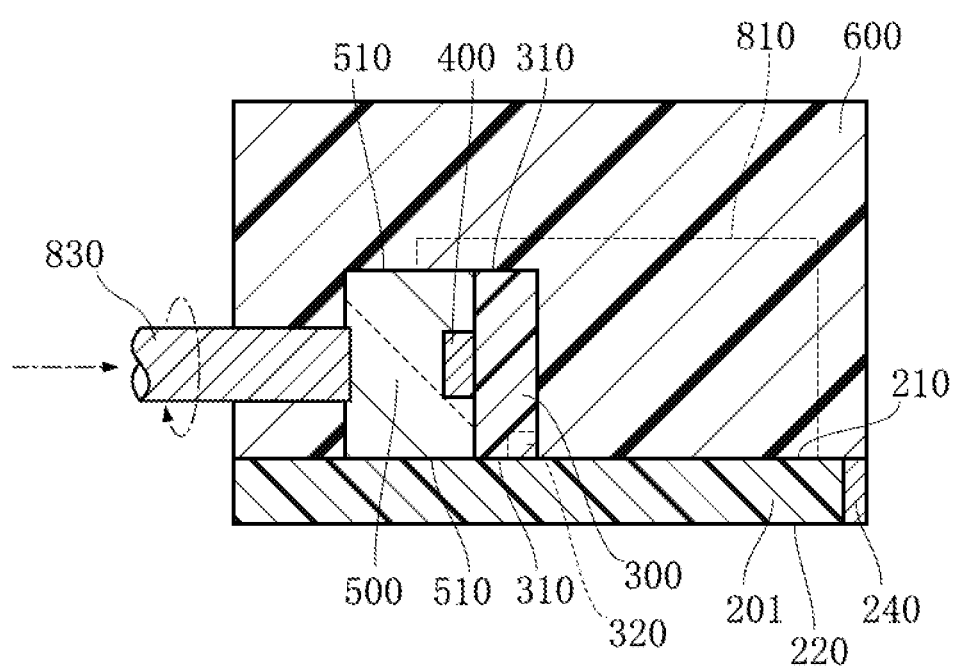
FIG. 23 is a schematic sectional view showing the method for making the optical communication module according to the fourth embodiment of the present invention.

FIGS. 22 and 23 show a method for making an optical communication module according to a fourth embodiment of the present invention. In this embodiment, after the steps described with reference to FIGS. 1-4 are performed, the steps described with reference to FIGS. 7-11 are performed without attaching the spacers 820 shown in FIGS. 5 and 6 to the first resin intermediate product 501. As a result, the intermediate product shown in FIG. 22 is obtained. In this intermediate product, the entirety of the first resin member 500 is covered by the second resin member 600.

Figure 24:
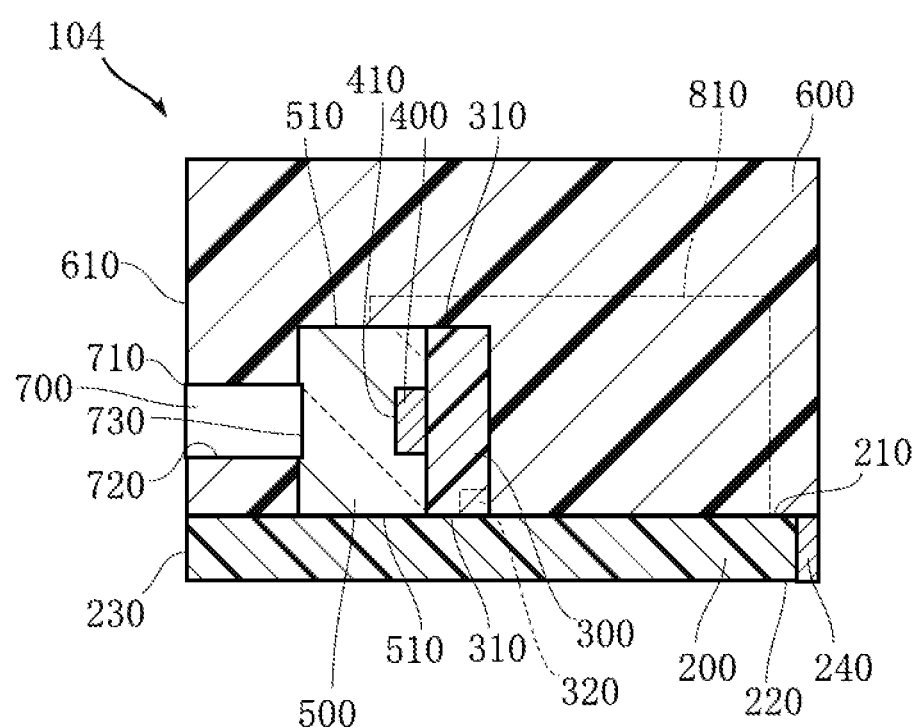
FIG. 24 is a sectional view of the optical communication module according to the fourth embodiment of the present invention.

Then, as shown in FIG. 23, cutting is performed. For instance, a drill 830 is moved from the outside of the second resin member 600 toward the optical function region 410 of the optical semiconductor element 400 so that the front end of the drill 830 penetrates through the second resin member 600 to reach the first resin member 500. Thus, the optical communication module 104 shown in FIGS. 24 and 25 is obtained.

Figure 25:
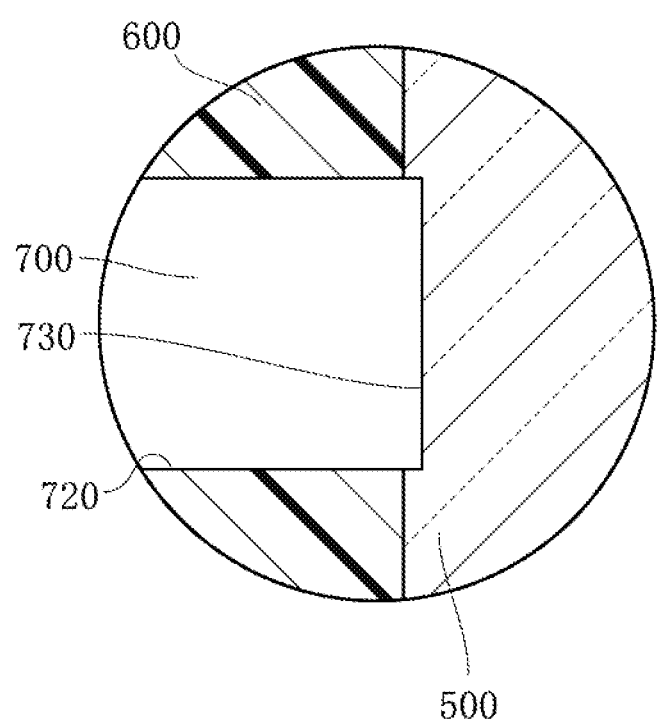
FIG. 25 is a schematic enlarged sectional view of the optical communication module of FIG. 24.

In the optical communication module 104, as shown in FIG. 25, the first resin member 500 is formed with a shallow recess, and the bottom surface of the recess constitutes the bottom surface 730 of the attachment hole 700. While most part of the inner side surface 720 of the attachment hole 700 is provided by the second resin member 600, the small portion connected to the bottom surface 730 is provided by the first resin member 500.

According to this embodiment again, the optical communication module 104 can be manufactured efficiently and reduced in size.

The optical communication module and the method for making the module according to the present invention are not limited to the foregoing embodiments. The specific structure of the optical communication module and the method for making the module can be varied in design in many ways.

The invention claimed is:

1. An optical communication module comprising:
   an optical semiconductor element including an optical function region that performs light-receiving function or light-emitting function;
   a first resin member covering the optical semiconductor element, the first resin member being made of a resin that transmits light emitted from the optical function region or light to be received by the optical function region;
   a second resin member covering the first resin member; and
   a main substrate comprising an obverse surface and a reverse surface, the obverse surface being in contact with the second resin member;
   wherein the optical communication module comprises an attachment hole for attaching an optical fiber, the attachment hole exposing a part of the first resin member and being open at an outer surface of the second resin member,
   the second resin member comprises an opening end surface at which an opening of the attachment hole is open, and
   the main substrate comprises a substrate end surface that is flush with the opening end surface of the second resin member.

2. The optical communication module according to claim 1, wherein the attachment hole includes a bottom surface provided by a part of the first resin member and an inner side surface provided by a part of the second resin member.

3. The optical communication module according to claim 2, wherein the bottom surface and the optical function region overlap each other as viewed in a depth direction of the attachment hole.

4. The optical communication module according to claim 2,
   wherein a depth direction of the attachment hole is in parallel with the obverse surface of the main substrate.

5. The optical communication module according to claim 4, further comprising a sub-substrate on which the optical semiconductor element is mounted, the sub-substrate standing on the obverse surface of the main substrate.

6. The optical communication module according to claim 5, wherein the depth direction of the attachment hole is perpendicular to the sub-substrate.

7. The optical communication module according to claim 5, wherein the first resin member is in contact with the obverse surface of the main substrate.

8. The optical communication module according to claim 5, wherein the sub-substrate is in a form of a rectangle having four side surfaces, and the first resin member includes four side surfaces that are flush with the four side surfaces of the sub-substrate, respectively.

9. The optical communication module according to claim 4, wherein the reverse surface of the main substrate is a mount surface for surface-mounting.

10. The optical communication module according to claim 4, further comprising a control IC mounted on the obverse surface of the main substrate.

11. The optical communication module according to claim 2, wherein the first resin member includes a main body and a thin layer portion, the main body covering the optical semiconductor element and including a light transmitting surface perpendicular to the depth direction of the attachment hole, the thin layer portion covering at least part of the light transmitting surface and providing the bottom surface of the attachment hole.

12. The optical communication module according to claim 11, wherein the thin layer portion includes an edge around a portion providing the bottom surface, the edge being positioned between the main body and the second resin member.

13. The optical communication module according to claim 2, wherein a portion of the first resin member which covers the optical semiconductor element and a portion of the first resin member which provides the bottom surface of the attachment hole are made of a same material.

14. The optical communication module according to claim 13, wherein the bottom surface of the attachment hole is closer to the optical semiconductor element than a surface of the first resin member which is in contact with the second resin member is.

15. The optical communication module according to claim 14, wherein the first resin member includes a portion which is positioned between the surface in contact with the second resin member and the bottom surface of the attachment hole and which provides the inner side surface of the attachment hole.

16. The optical communication module according to claim 1, wherein a cross sectional dimension of the attachment hole increases as proceeding toward the opening in the depth direction.

17. The optical communication module according to claim 1, wherein the second resin member is made of opaque resin.

18. A method for making an optical communication module, the method comprising the steps of:

forming a first resin member by covering an optical semiconductor element with a resin, the optical semiconductor element including an optical function region that performs light-receiving function or light-emitting function, the resin transmitting light emitted from the optical function region or light to be received by the optical function region;

attaching a spacer to a portion of the first resin member which is on an opposite side of the optical semiconductor element;

forming a second resin intermediate product by covering the first resin member and the spacer with a resin;

forming a second resin member that exposes a part of the spacer by collectively removing a part of the second resin intermediate product and a part of the spacer; and removing the spacer.

19. The method for making an optical communication module according to claim 18, wherein the spacer is made of a material different from the first resin member and the second resin member, and the step of removing the spacer comprises dissolving the spacer.

20. The method for making an optical communication module according to claim 19, further comprising the step of attaching the first resin member to a main substrate including an obverse surface and a reverse surface, wherein the step of forming the second resin intermediate product comprises forming the second resin intermediate product in contact with the obverse surface of the main substrate, and the spacer is made of a material different from a material forming the obverse surface of the main substrate.

21. The method for making an optical communication module according to claim 18, wherein the spacer is made of a metal.

22. The method for making an optical communication module according to claim 18, wherein the spacer is columnar.

23. The method for making an optical communication module according to claim 18, wherein the step of attaching the spacer comprises attaching the spacer to the first resin member with a resin adhesive that transmits light emitted from the optical function region or light to be received by the optical function region.

* * * * *